United States Patent
Byers

(10) Patent No.: US 9,974,176 B2
(45) Date of Patent: May 15, 2018

(54) MASS STORAGE INTEGRATION OVER CENTRAL PROCESSING UNIT INTERFACES

(71) Applicant: Cisco Technology, Inc., San Jose, CA (US)

(72) Inventor: Charles Calvin Byers, Wheaton, IL (US)

(73) Assignee: Cisco Technology, Inc., San Jose, CA (US)

( * ) Notice: Subject to any disclaimer, the term of this patent is extended or adjusted under 35 U.S.C. 154(b) by 293 days.

(21) Appl. No.: 14/796,175

(22) Filed: Jul. 10, 2015

(65) Prior Publication Data

US 2017/0010628 A1    Jan. 12, 2017

(51) Int. Cl.
| | | |
|---|---|---|
| *H05K 1/14* | (2006.01) | |
| *G06F 12/00* | (2006.01) | |
| *G06F 1/18* | (2006.01) | |
| *G06F 9/46* | (2006.01) | |

(52) U.S. Cl.
CPC ............... *H05K 1/14* (2013.01); *G06F 1/185* (2013.01); *G06F 9/46* (2013.01); *G06F 12/00* (2013.01)

(58) Field of Classification Search
CPC ...................................................... H05K 1/14
See application file for complete search history.

(56) References Cited

U.S. PATENT DOCUMENTS

| | | |
|---|---|---|
| 7,047,374 B2 | 5/2006 | Sah et al. |
| 7,757,033 B1 | 7/2010 | Mehrotra et al. |
| 2003/0126376 A1 | 7/2003 | Blankenship et al. |
| 2007/0070673 A1* | 3/2007 | Borkar .................. G06F 1/3203 365/63 |
| 2010/0162065 A1* | 6/2010 | Norman .................... G11C 5/02 714/746 |
| 2011/0082965 A1 | 4/2011 | Koka et al. |
| 2015/0134868 A1* | 5/2015 | Shaeffer ................ G06F 13/126 710/300 |
| 2016/0183374 A1* | 6/2016 | Prakash .................. H01L 23/00 361/719 |

* cited by examiner

*Primary Examiner* — Farley Abad
(74) *Attorney, Agent, or Firm* — Edell, Shapiro & Finnan, LLC

(57) ABSTRACT

An apparatus includes a motherboard, a storage module, a first socket arranged on the motherboard, a second socket also arranged on the motherboard, and an interface. A processor is arranged within the first socket and a storage module is arranged within the second socket. The interface is configured to provide intercommunication between the processor and the storage module. The storage module contains a plurality of nonvolatile memory cards.

20 Claims, 4 Drawing Sheets

US 9,974,176 B2

MASS STORAGE INTEGRATION OVER CENTRAL PROCESSING UNIT INTERFACES

TECHNICAL FIELD

The present disclosure relates to providing storage to computing devices, and in particular, providing storage to computing devices utilizing multi-socket motherboards.

BACKGROUND

Many computational and networking problems require hierarchical storage and very fast access to terabyte-size data sets. Servers typically use large dynamic random-access memory banks for high performance storage (i.e. in-memory databases) and arrays of solid state or rotating disk drives connected over a serial disk interface for high capacity storage. These disk interfaces are either directly integrated into System-on-Chip (SoC) central processing units (CPUs), or are provided by a peripheral disk interface chip connected to the CPU's input/output (I/O) expansion bus.

In multi-socket servers, if one CPU needs to access data stored in the I/O subsystem of another CPU socket, the other CPU cooperates by launching the request, and the data is transferred between CPU sockets over a cache coherency interface. In the case of Intel Xeon™ class CPUs, this coherency interface is the QuickPath Interface (QPI™), which is a wide, fast, very low latency inter-chip bus. Other types of multi-socket CPUs use different coherency interface specifications with similar functions.

Large DRAM arrays are expensive, volatile, and require large physical volume and operational power. Individual disk drives, on the other hand, have specific read and write bandwidth limitations. Multiple drives need to be used in parallel to achieve high disk channel bandwidth. The single lane serial I/O interfaces that connect the drives to the disk controller in typical servers have a maximum sustained bandwidth of a few gigabits per second. Furthermore, the need to get multiple CPU chips involved in a simple disk transaction in multi-socket servers adds overhead.

DESCRIPTION OF EXAMPLE EMBODIMENTS

Overview

According to the embodiments presented herein, an apparatus is provided that includes a motherboard, a storage module, a first socket arranged on the motherboard, a second socket also arranged on the motherboard, and an interface. A processor is arranged within the first socket and a storage module is arranged within the second socket. The interface is configured to provide intercommunication between the processor and the storage module. The storage module contains a plurality of nonvolatile memory cards.

Example Embodiments

Figure 1:
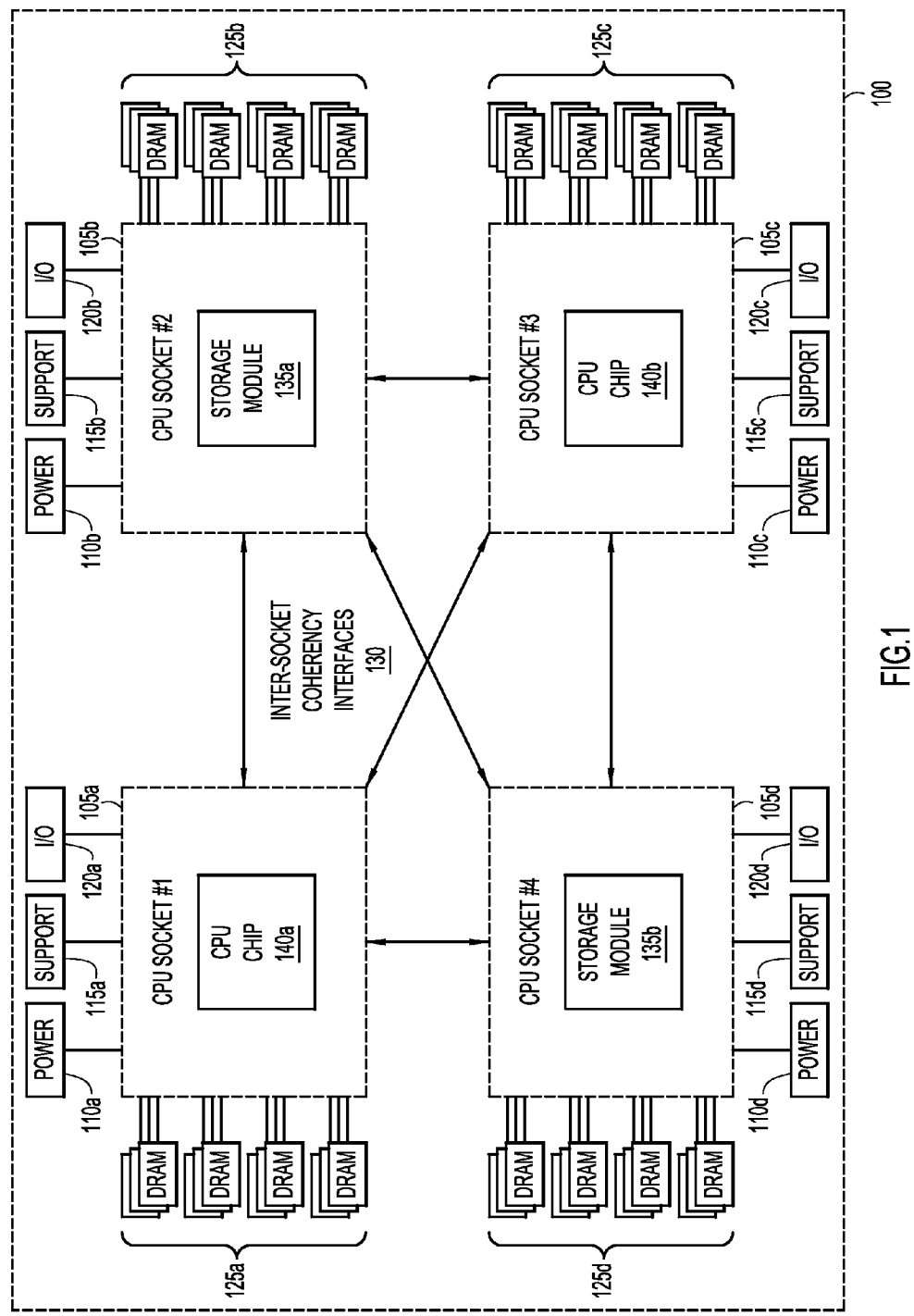
FIG. 1 is a multi-socket motherboard configured to provide mass storage integration over central processing unit interfaces, according to an example embodiment.

With reference made to FIG. 1, depicted therein is motherboard 100. Motherboard 100 is a multi-socket motherboard, and therefore, includes a plurality of central processing unit (CPU) sockets. Specifically, motherboard 100 includes four CPU sockets 105*a-d*. According to the example of FIG. 1, sockets 105*a-d* are identical in that they all include a power subsystem 110*a-d* capable of powering a high-power CPU chip, support circuits 115*a-d* that provide support functions such as timing and management functions, and an input/output (I/O) subsystem 120*a-d* such as a Peripheral Component Interface Express (PCIe) bus. In other words, motherboard 100 is a multi-socket motherboard that may be included in a multi-socket server. Motherboard 100 is shown as a quad-socket motherboard, though motherboards of 2 or more sockets are also multi-socket motherboards as described herein.

Each socket also contains a multichannel main memory subsystem 125*a-d*, which according to the example of FIG. 1 is one or more banks, each containing one or more dynamic random-access memory (DRAM) dual in-line memory modules (DIMMs). Interconnecting the sockets is a set of inter-socket interfaces 130, which according to the example of FIG. 1 is a coherency interface. Coherency interface 130 may be embodied as a wide, fast, low latency inter-chip bus. Accordingly, coherency interface 130 forms a full mesh between the four sockets 105*a-d*, permitting any of sockets 105*a-d* to access any other of sockets 105*a-d* with low latency and high bandwidth.

In conventional servers, storage for the server may be implemented separately from the motherboard in the form of Redundant Arrays of Inexpensive Disks (RAID arrays) or in the form of solid state drives (SSDs) comprised of large arrays of non-volatile memory chips, or in the form of random access memory (RAM) caches containing large numbers of DRAM modules. The drives may connect to the motherboard through the I/O interfaces of the CPU sockets. In multi-socket servers, if one CPU needs to access data stored in the I/O subsystem of another CPU socket, the other CPU cooperates by launching the request, and the data is transferred between CPU sockets over the coherency interface. These forms of storage place significant limits on the performance and capacity of many important data-rich server applications. For example, large DRAM arrays are expensive, volatile, and require large physical volume and operational power, while RAID arrays have specific read and write bandwidth limitations. Specifically, the single lane serial I/O interfaces that connect to the individual drives of RAID arrays in typical servers have a maximum sustained bandwidth of a few gigabits per second each. If higher bandwidths to storage are required, arrays of large numbers of disk drives or SSDs need to be configured to operate in parallel.

In order to overcome these limitations, motherboard 100 implements mass storage integration over CPU cache coherency interfaces. Specifically, instead of placing a CPU in sockets 105*b* and 105*d*, motherboard 100 is configured with storage modules 135*a* and 135*b* arranged within sockets 105*b* and 105*d*, respectively. According to the example of FIG. 1, storage modules 135*a* and 135*b* contain massively parallel arrays of high capacity flash chips, and internal logic to interface the storage arrays to inter-socket coherency interface 130. The arrays of flash chips may include arrays of Secure Digital (SD) flash chips, such as microSD™ microSDHC™, microSDXC™, miniSD™ and/or miniS-DHC™ flash chips. The flash chips may also include universal serial bus (USB) memory sticks. Each of storage modules 135a and 135b may have tens of terabytes of non-volatile storage capacity, as will be described in greater detail below with reference to FIGS. 2 and 3. Furthermore, storage modules 135a and 135b, by virtue of their use of the inter-socket coherency interfaces 130 instead of the much slower I/O subsystems 120, can access bandwidth dozens of times higher than a single traditional disk drive. Therefore, storage modules 135a and 135b may overcome the limitations of traditional RAID arrays and solid state drives.

Furthermore, because storage modules 135a and 135b are configured to fit the same CPU socket as CPUs 140a and 140b, a server utilizing a motherboard like motherboard 100 may provide flexible storage and processing options, depending on the application for which the server is being utilized. For example, servers that are configured for computationally intensive applications may utilize three of the CPU sockets 105a-d to house CPUs, which would share a single storage module in the fourth of the sockets 105a-d. Servers configured for balanced applications may require a more balanced configuration like that of FIG. 1 in which two of CPU sockets 105a-d house CPUs, with the remaining two sockets housing storage modules. Servers configured for storage intensive applications (e.g., "Big Data" applications) may utilize three of the CPU sockets 105a-d for storage modules, while utilizing the fourth of the CPU sockets 105a-d for a CPU. In motherboards with less or more than four sockets, storage modules and CPUs may be similarly distributed among the CPU sockets to meet the storage and processing requirements of any particular server. In order to facilitate the different configurations, power subsystems 110a-d may be configured to power either one of a CPU chip or a storage module. Said differently, storage modules 135a and 135b may be configured to utilize the same power subsystems 110a-d as CPU chips 140a and 140b. Similarly, storage modules 135a and 135b may be configured to use the same support infrastructures 115a-d, I/O structures 120a-d, and memory subsystems 125a-d as CPU chips 140a and 140b, making them socket compatible.

Furthermore, because the memory of storage modules 135a and 135b is provided by arrays of flash chips, storage modules 135a and 135b may provide added convenience, heightened security, and/or in-place upgradeability. Specifically, the flash chips of storage modules 135a and 135b may be easily removed. The removed flash chips allow for easy transport of the storage media. The removable flash chips may also provide increased security. For example, when it comes time to replace a server, the flash chips may be easily removed from the storage module prior to disposal or recycling of the server and/or motherboard 100. Furthermore, flash chips that have failed may be easily removed and replaced, and storage capacity may be easily upgraded simply by replacing lower capacity flash chips with higher capacity flash chips.

Figure 2:
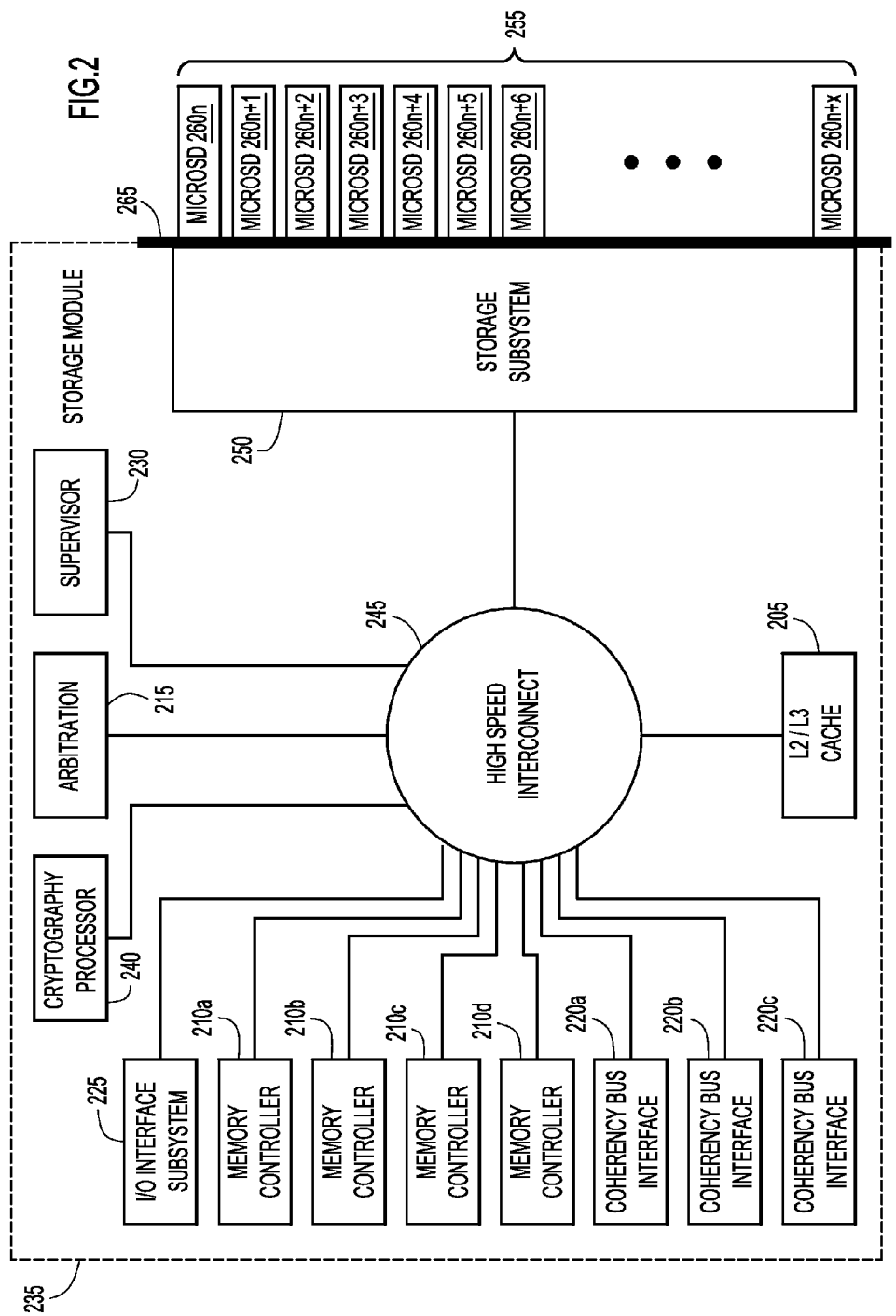
FIG. 2 is an illustration of the logical structure of a storage module configured to provide mass storage integration over central processing unit interfaces, according to an example embodiment.

With reference now made to FIG. 2, depicted therein is a logical view of a storage module 235 according to the concepts disclosed herein. Storage module 235 resembles a multi-core CPU or System on Chip (SoC) in many ways, with internal L2/L3 cache memories 205, external memory controllers 210a-d, arbitration circuits 215, coherency bus interfaces 220a-c, I/O bus interfaces 225, supervisory circuits 230, cryptography blocks 240, and a high speed internal interconnect 245 to allow all of the logical units of storage module 235 to intercommunicate. However, where multiple CPU cores would usually appear in a traditional CPU architecture, storage module 235 has a high performance storage subsystem 250 instead.

Storage subsystem 250 is not to be confused with main memory subsystems 125a-d of FIG. 1. The main memory subsystems 125a-d of FIG. 1 may connect to storage module 235 through memory controllers 210a-d, shown in FIG. 2. Storage subsystem 250, on the other hand, provides the mass storage for the motherboard and/or server in which storage module 235 is arranged. Furthermore, storage subsystem 250 has ports on internal interconnect 245 to tie it into the rest of storage module 235 with high bandwidth. Storage subsystem 250 also contains ports to access a large, parallel array 255 of flash storage modules $260n$-$260n+x$ that are integrated through interposer 265. Several functions are implemented by the logic of the storage subsystem 250, including decoding of storage read/write requests, sequencing, partitioning, multi-level storage cache management, striping, FAT table management, MMU-like functions, access control, security, error control, redundancy, and wear leveling.

In operation, storage access requests arrive from CPUs in other sockets over the coherency interfaces 220a-c (or perhaps the I/O interface 225 in some application models), are parsed by the supervisory circuit 230, and are processed by the storage subsystem 250. Optional cryptographic processing performed by cryptography processor 240 can insure the privacy of stored data. In some cases, the data requested may be located in the internal L2/L3 cache 205, or DRAM DIMMs connected to memory controllers 210a-d. Storage subsystem 250 segments the read or write request among the parallel flash modules $260n$-$260n+x$, completes the storage request, and returns the results back through the coherency interfaces 220a-c.

Multi-level cache 205 may also be used to greatly improve the performance of the storage operations performed by storage subsystem 250. For example, if storage module 235 is embodied as an Application Specific Integrated Circuit (ASIC), internal L2/L3 cache 205 may be included as tens of megabytes of ultra-fast RAM similar to the internal cache on a multi-core CPU. This internal cache 205 may be utilized for the highest performance accesses of storage subsystem 250. A much larger cache (tens of gigabytes) could be implemented in the external DRAM DIMM arrays associated with the storage module's memory controllers (e.g., main memory subsystem 125a-d of FIG. 1). The third level of cache may utilize the large storage (e.g., tens of terabytes) of parallel array 255 of flash chips $260n$-$260n+x$.

From a software perspective, storage module 235 may be organized in different ways. For example, from a software perspective, storage module 235 may appear to other devices, such as CPUs in other sockets, as a CPU chip with a very large main memory subsystem, i.e., with a very large DRAM bank. From this perspective, storage module 235 would appear to other devices as a flat, coherent memory spectrum 1 to 2 orders of magnitude larger than traditional DRAM banks, but with similar performance. According to other software implementations, storage module 235 may appear as a disk array, such as a highly parallel, high performance RAID file system. These two appearances may also be hybridized so that storage module 235 appears to other devices as a mix of high speed and high storage capacity. Such a hybrid approach may be suited for high performance big data applications.

Figure 3:
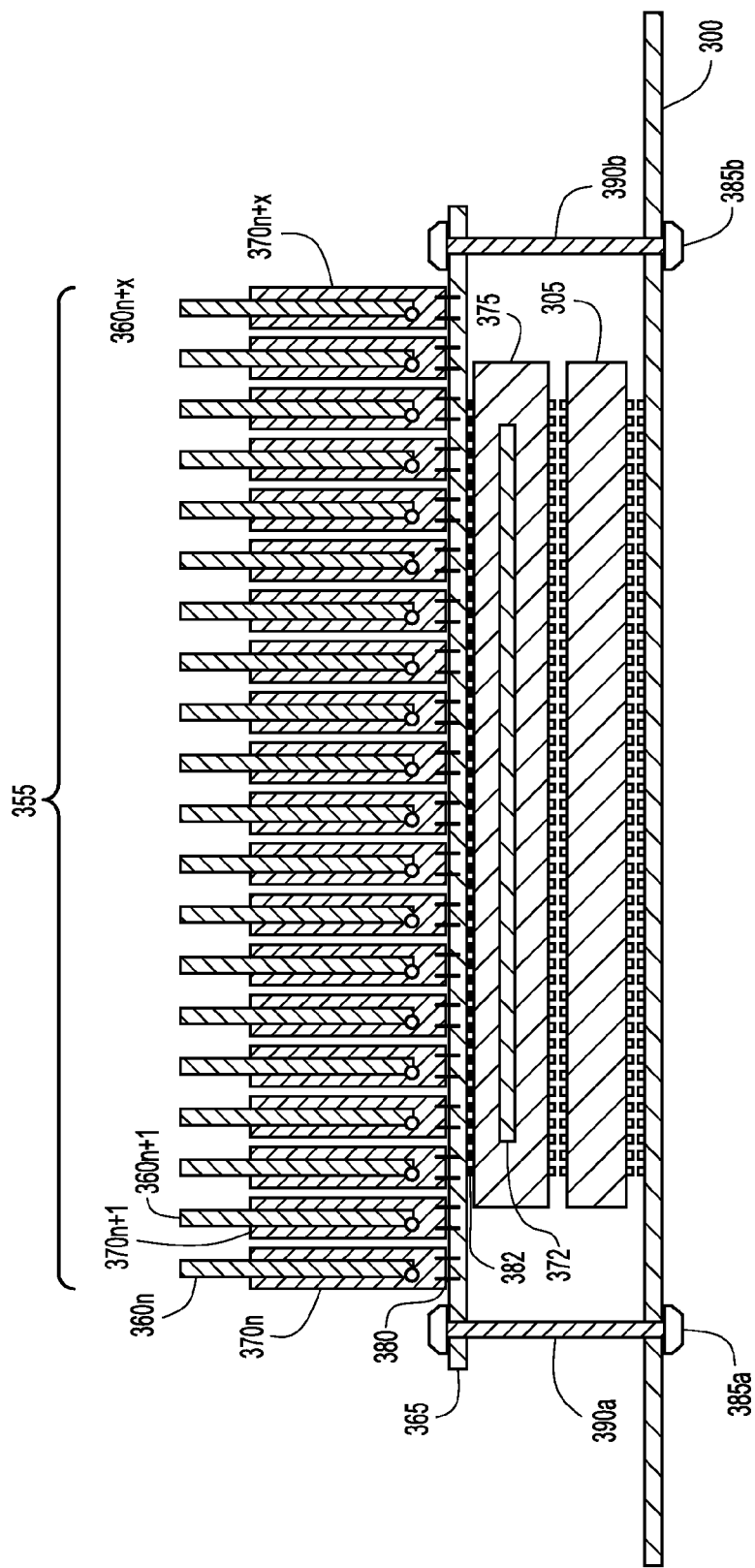
FIG. 3 is an illustration of the physical structure of a storage module configured to provide mass storage integration over central processing unit interfaces, according to an example embodiment.

With reference now made to FIG. 3, depicted therein is an example of a physical view of a storage module 335. Specifically, FIG. 3 presents a side view of a mechanical design for the storage module 335. As with the examples of FIGS. 1 and 2, the physical storage for storage module 335 of FIG. 3 is provided by an array 355 of microSD™ cards 360n-360n+x. Each of microSD™ cards 360n-360n+x is arranged within memory card sockets 370n-370n+x, respectively. Memory card sockets 370n-370n+x, in turn, are communicatively coupled to storage module ASIC chip 372 through interposer 365 and ASIC package 375. Other example storage modules may directly solder memory cards 360n-360n+x to interposer 365.

Storage module 335 may dissipate an amount of heat that is a fraction of that dissipated by the highest power multi-core CPUs that motherboard 300 is designed to carry. Accordingly, cooling of storage module 335 may be achieved without a heatsink beyond the conduction down to motherboard 300 and/or up through the microSD™ array 355. Therefore, array 355 of microSD™ cards 360n-360n+x and memory card sockets 370n-370n+x may comprise a two-dimensional array vertically arranged so that the combination of microSD™ cards 360n-360n+x and memory card sockets 370n-370n+x occupy much the same space as the fins of the heatsink recommended for the CPU that would otherwise occupy the CPU sockets of motherboard 300.

The top of interposer 365 may be configured with a high number of pins 380, each capable of receiving connections from memory card sockets 370n-370n+x. In other words, interposer 365 is similar in construction to a PC board with connections on its top surface that interface with memory card sockets 370n-370n+x and connections on its bottom surface that mate with an array of pins 382 on top of ASIC package 375. The pins 382 of ASIC package 375 connect the pins 380 of interposer 365 to storage module ASIC chip 372. Electrical routing traces on interposer 365 may also connect to storage module ASIC chip 372. ASIC chip 372 may be configured with circuits that carry out the functions described with reference to FIG. 2, including internal L2/L3 cache memories 205, external memory controllers 210a-d, arbitration circuits 215, coherency bus interfaces 220a-c, I/O bus interfaces 225, supervisory circuits 230, cryptography blocks 240, and high speed internal interconnect 245. ASIC package 375 then connects ASIC chip 372 to CPU socket 305 and thence to motherboard 300.

ASIC package 375 and ASIC chip 372 may be formed using through silicon via technologies to facilitate making connections in two directions (down to motherboard 300 and up to interposer 365). In order to connect to CPU socket 305, ASIC package 375 is configured to have the same footprint, pin-out, signal descriptions and physical volume as the CPUs for which CPU socket 305 has been designed. Therefore, ASIC chip 372 can operate on server motherboard 300. Specifically, ASIC package 375 is a high performance package configured with pads that interface to pins in CPU socket 305. ASIC package 375 may have the same footprint as a merchant market CPU chip (for example, a LGA2011 pinout in support of Intel™'s Core I7™ server CPUs).

The same mounting points 385a and 385b used to secure a CPU heatsink to motherboard 300 may also be used to secure storage module 335 to motherboard 300. Accordingly, screws 390a and 390b may be positioned on interposer 365 such that they engage with the same mounting points 385a and 385b (e.g., heatsink mounting hardware) that would be used to screw a CPU heatsink to motherboard 300. In other embodiments, other mechanical mounting devices, such as bails or clips, may be used.

Using an arrangement as illustrated in FIG. 3, one particular embodiment of storage module 335 may take the following form. Memory card sockets 370n-370n+x may be embodied as memory card sockets similar in size and performance to Yamaichi PJS008U-3000-0 which permits arraying vertically oriented microSDs™ on 12.8×4.9 mm centers. Assuming an overall heatsink footprint for socket 305 that is similar in size to an LGA2011 130 W socket, a 90 mm×100 mm size area is available for array 355. Accordingly, array 355 may include a 7×20 two-dimensional array of microSD™ or 140 total microSD™ in the volume that would be occupied by the heatsink if a CPU chip had been installed in socket 305. Assuming 128 of microSD™ 360n-360n+x are active (the remaining 12 of microSD™ cards 360n-360n+x may provide redundancy for wear leveling or fault tolerance), and assuming each microSD™ card 360n-360n+x has a capacity of 128 GB, the total capacity of storage module 335 is 16 TB. With three such storage modules installed in a four-socket motherboard, 48 TB of fast, nonvolatile storage capacity can be provided to a single motherboard. If the read/write speed of each microSD™ 360n-360n+x is 100 MB/s, the aggregate bandwidth for each storage module is 12.8 GB/s. Accordingly, installing storage modules like storage module 335 in CPU sockets of a multi-socket server may offer significant performance advantages compared to more traditional mass storage infrastructures.

Figure 4:
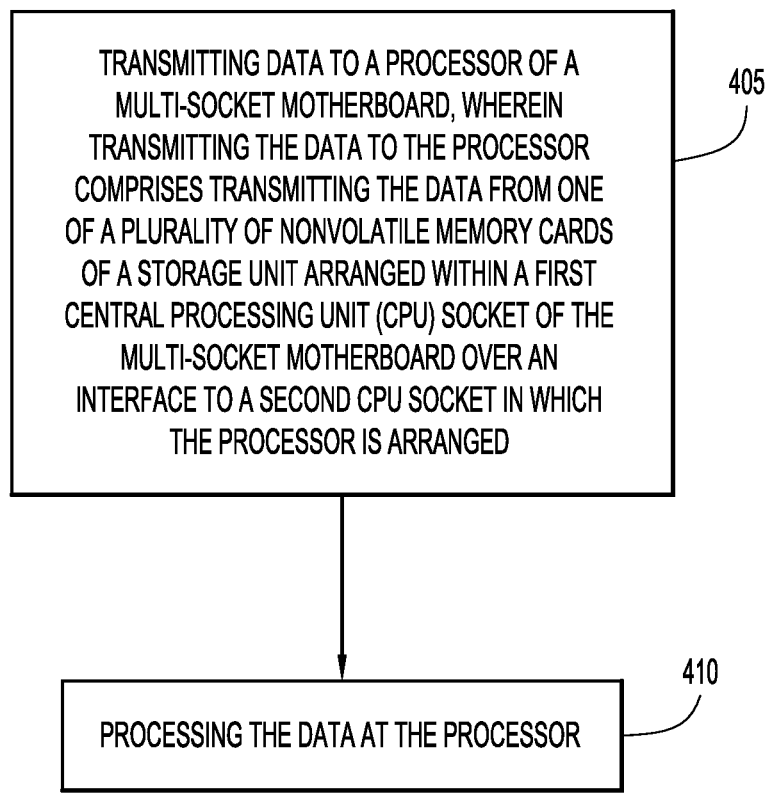
FIG. 4 is a flowchart illustrating a method of providing mass storage integration over central processing unit interfaces, according to an example embodiment.

With reference now made to FIG. 4, depicted therein is a flowchart 400 illustrating a method for providing mass storage integration over CPU cache coherency interfaces. At 405, data is transmitted from a plurality of non-volatile memory cards of a storage unit arranged within in a first CPU socket of the multi-socket motherboard to a processor arranged in a second CPU socket of the multi-socket motherboard. Specifically, the transmission of the data may include transmitting the data from one of a plurality of non-volatile memory cards arranged in a two-dimensional array like those illustrated in FIGS. 2 and 3. The nonvolatile memory cards may include SD flash memory cards, microSD™ memory cards, or USB memory sticks. The data may be transferred from the memory cards, through an interposer and ASIC package to a storage module ASIC. This transfer may be carried out in response to instructions provided by logical circuits of the ASIC. The data is further transferred from the ASIC to the first CPU socket of the multi-socket motherboard. The data is then transferred from the first CPU socket to the second CPU socket through an inter-socket interface of the multi-socket motherboard. The inter-socket interface may include a coherency interface providing a wide, fast, low latency inter-chip bus. Once received at the CPU, the data is processed at 410.

When data is to be stored in a storage unit like those illustrated in FIGS. 1-3, the process of FIG. 4 may be reversed. Furthermore, a hierarchy of storage capabilities may be included in each storage module, where the data may be stored in the MicroSD array 355, associated main memory subsystem 125, or L2/L3 cache 205, depending upon the size, importance, age, or performance requirements of each piece of data.

In summary, in one form, an apparatus is provided that includes a motherboard, a storage module, a first socket arranged on the motherboard, a second socket also arranged on the motherboard, and an interface. A processor is arranged within the first socket and a storage module is arranged within the second socket. The interface is configured to provide intercommunication between the processor and the storage module. The storage module contains a plurality of memory card sockets, and a plurality of nonvolatile memory cards. Each of the plurality of nonvolatile memory cards is arranged within one of the plurality of memory card sockets.

In another form, an apparatus is provided that includes a plurality of memory card sockets, a plurality of nonvolatile memory cards, an interposer and a storage module application specific integrated circuit package. Each of the plurality of nonvolatile memory cards is arranged within one of the plurality of memory card sockets. The interposer is arranged between the plurality of memory card sockets and the storage module application specific integrated circuit package. The storage module ASIC package is configured to connect to a central processing unit socket of a multi-socket motherboard. The apparatus may be arranged in a second central processing unit socket of the multi-socket motherboard.

In still another form, a method is provided that includes transmitting data to a processor of a multi-socket motherboard, and processing the data at the processor. The transmission of the data includes transmitting the data from one of a plurality of nonvolatile memory cards of a storage unit arranged within a first central processing unit socket of the multi-socket motherboard over an interface to a second central processing unit socket in which the processor is arranged.

By implementing the above-described apparatuses and methods, multi-terabyte, very high bandwidth storage module consisting of a massively parallel array of flash memory cards such as microSD™ cards may be used to provide mass storage for multi-socket motherboards. The storage module may be configured to fit the same socket as a high-performance multicore CPU chip that would otherwise occupy the CPU socket currently occupied by the storage module. By arranging the storage module within a CPU socket, server motherboards may be configured with various configurations of high performance storage and computational power. Furthermore, the high speed inter-socket coherency links between the sockets of the multi-socket motherboard may be employed as very high bandwidth interfaces to the storage modules. Such an arrangement of storage modules and CPUs allows for various combinations of CPU power and storage capabilities on a single design of multi-socket motherboard, provides very high storage data throughput (e.g., throughput 24 times faster than high performance SSDs), provides very high storage capacity (e.g., 4 times larger storage size than the biggest rotating disks), and high volumetric density. The devices and techniques described herein may also support both flat memory and filesystem based application models. Finally, the devices and techniques described herein allow for subsets of the storage module's flash cards to be removed for media transportation, heightened security, or in-place upgrading.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:
1. An apparatus comprising:
a motherboard;
a storage module comprising a plurality of nonvolatile memory cards providing mass storage to the apparatus;
a first Central Processing Unit (CPU) socket arranged on the motherboard, wherein a processor is arranged within the first CPU socket;
a second CPU socket arranged on the motherboard, wherein the storage module is arranged within the second CPU socket, the storage module not including a CPU core and/or cache; and
an interface configured to provide intercommunication between the processor and the storage module.

2. The apparatus of claim 1, wherein the storage module further comprises a plurality of memory card sockets, wherein each of the plurality of nonvolatile memory cards is arranged within one of the plurality of memory card sockets.

3. The apparatus of claim 2, wherein the storage module further comprises a storage module application specific integrated circuit (ASIC) package and an interposer arranged between the plurality of memory card sockets and the storage module ASIC package, and wherein the storage module ASIC package is configured to connect to the second CPU socket.

4. The apparatus of claim 1, wherein the plurality of nonvolatile memory cards comprises a plurality of secure digital (SD) flash memory cards.

5. The apparatus of claim 4, wherein the plurality of nonvolatile memory cards comprises a plurality of micro SD flash memory cards.

6. The apparatus of claim 1, wherein the plurality of nonvolatile memory cards comprises a plurality of Universal Serial Bus (USB) memory stick memory cards.

7. The apparatus of claim 1, wherein the processor, the storage module, the first CPU socket and the second CPU socket are configured such that the processor and the storage module may be exchanged between the first CPU socket and the second CPU socket.

8. The apparatus of claim 7, further comprising a first power subsystem and a second power subsystem, wherein the storage module is configured to be powered by the first power subsystem when in the first CPU socket and to be powered by the second power subsystem when in the second CPU socket.

9. An apparatus comprising:
a plurality of memory card sockets;
a plurality of nonvolatile memory cards, wherein each of the plurality of nonvolatile memory cards is arranged within one of the plurality of memory card sockets;
an interposer;
a storage module application specific integrated circuit (ASIC) package; and
a multi-socket mother board comprising a plurality of central processing unit (CPU) sockets;
wherein the interposer is arranged between the plurality of memory card sockets and the storage module ASIC package, and
wherein the storage module ASIC package is configured to connect to the first CPU socket of the plurality of the CPU sockets of the multi-socket motherboard and provide mass storage to the multi-socket motherboard, and
wherein the storage module ASIC package does not include a CPU core and/or cache.

10. The apparatus of claim 9, wherein the plurality of nonvolatile memory cards comprises a plurality of secure digital (SD) flash memory cards.

11. The apparatus of claim 10, wherein the plurality of nonvolatile memory cards comprises a plurality of micro SD flash memory cards.

12. The apparatus of claim 9, wherein the plurality of nonvolatile memory cards comprises a plurality of Universal Serial Bus (USB) memory stick memory cards.

13. The apparatus of claim 9, wherein the plurality of nonvolatile memory cards are arranged in a two-dimensional array.

14. The apparatus of claim 9, wherein a first subset of the plurality of nonvolatile memory cards is configured to provide storage to the multi-socket motherboard and a second subset of the plurality of nonvolatile memory cards is configured to provide storage redundancy for the first subset of the plurality of nonvolatile memory cards.

15. The apparatus of claim 9, further comprising a mounting device comprising at least one of a mounting screw, a bail, or a clip, wherein the mounting device is configured to attach to heatsink mounting hardware of the motherboard to secure the interposer to the motherboard.

16. A method comprising:
   transmitting data to a processor of a multi-socket motherboard, wherein transmitting the data to the processor comprises transmitting the data from one of a plurality of nonvolatile memory cards of a storage unit arranged within a first central processing unit (CPU) socket of the multi-socket motherboard over an interface to a second CPU socket in which the processor is arranged; and
   processing the data at the processor,
   wherein the data comprises mass storage data for a computing device utilizing the multi-socket motherboard, and
   wherein the storage unit does not contain a CPU core or cache.

17. The method of claim 16, wherein transmitting the data from the one of a plurality of nonvolatile memory cards comprises transmitting the data from one of a plurality of secure digital (SD) flash memory cards.

18. The method of claim 17, wherein transmitting the data from the one of a plurality of nonvolatile memory cards comprises transmitting the data from one of a plurality of micro SD flash memory cards.

19. The method of claim 16, wherein transmitting the data over the interface comprises transmitting the data over an inter-socket coherency interface.

20. The method of claim 19, wherein transmitting the data over the inter-socket coherency interface further comprises transmitting the data from the storage module ASIC package through the first CPU socket to the inter-socket coherency interface.

* * * * *